United States Patent
Pollock

(10) Patent No.: US 7,281,196 B2
(45) Date of Patent: Oct. 9, 2007

(54) SINGLE ERROR REED-SOLOMON DECODER

(75) Inventor: James Richard Pollock, San Jose, CA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 526 days.

(21) Appl. No.: 10/636,997

(22) Filed: Aug. 8, 2003

(65) Prior Publication Data

US 2005/0033791 A1   Feb. 10, 2005

(51) Int. Cl.
*H03M 13/00* (2006.01)
(52) U.S. Cl. .................. 714/784; 714/758; 714/756; 714/781
(58) Field of Classification Search ............... 714/784, 714/758, 762, 785, 755, 781, 746, 793, 782, 714/752
See application file for complete search history.

(56) References Cited

U.S. PATENT DOCUMENTS

| | | | | |
|---|---|---|---|---|
| 4,300,231 A | * | 11/1981 | Moffitt ...................... 370/268 |
| 5,361,266 A | * | 11/1994 | Kodama et al. ............. 714/758 |
| 5,491,701 A | * | 2/1996 | Zook .......................... 714/762 |
| 5,537,421 A | * | 7/1996 | Dujari et al. ................ 714/785 |
| 5,691,994 A | * | 11/1997 | Acosta et al. ............... 714/784 |
| 5,905,740 A | * | 5/1999 | Williamson ................. 714/784 |
| 6,360,349 B1 | * | 3/2002 | Kawanishi ................... 714/785 |
| 6,732,325 B1 | * | 5/2004 | Tash et al. ................... 714/785 |
| 6,829,741 B1 | * | 12/2004 | Khansari et al. ............. 714/755 |
| 2002/0199153 A1 | * | 12/2002 | Fall ............................. 714/781 |

\* cited by examiner

*Primary Examiner*—Guy Lamarre
*Assistant Examiner*—Fritz Alphonse
(74) *Attorney, Agent, or Firm*—McDermott Will & Emery LLP

(57) ABSTRACT

The error offset and the error magnitude of a data stream in a Read-Solomon code is calculated using the same architecture. The advantage this method has over previous techniques is its simplicity of design and the minimum steps required to convert the syndrome information into an error location and correction pattern. The maximum of four cycles (steps) needed to compute the offset and correction pattern allows for a correction to be applied in the byte time immediately following receipt of the last check byte.

19 Claims, 8 Drawing Sheets

SINGLE ERROR REED-SOLOMON DECODER

The present invention deals with a method and circuit for calculating necessary information to correct "single error" Reed-Solomon codes. More particularly, the present invention deals with a cost effective approach to determining an error offset and an error magnitude.

BACKGROUND

Reed-Solomon codes provide an easy way to generate t symbol correction codes requiring the addition of only 2*t parity symbols. However, the correction computation increases dramatically as the number of correctable symbols (t) is increased.

Much work has been done in the area of Reed-Solomon decoders when t is greater than one and many patents have been filed covering methods to handle this difficult operation. Schemes such as the Berlekamp-Massey and Euclidean algorithms have been developed to process syndrome bytes into Error-Locator and Error-Evaluator polynomials. The Chien Search and the Forney algorithm are typically used to extract the roots of these polynomials that are the error location and correction pattern information needed to correct each error.

The ability to correct multiple errors is an important capability in the communications field where burst errors in a communications channel are common due to various impulse noise sources. A method has been developed to handle large burst errors while avoiding the difficult decoding problems caused by increasing the size of t to handle larger and larger burst errors. An operation called interleaving is used to rearrange symbols prior to transmission so that succeeding symbols are covered by a different set of parity symbols. Using an interleave factor of five with a single error correcting code results in the ability to correct a burst of up to five consecutive symbol errors. When received and de-interleaved the burst of five symbol errors is transformed into five single symbol errors in five consecutive blocks.

Interleaving provides an easy way to extended the error correction capability of single error correcting codes while avoiding the hardware complexity and the added processing time of more powerful multi error correcting Reed-Solomon codes. In the following example each letter represents a single symbol in a data stream. The notation 'vv' represents the two parity symbols at the end of a block and each block covered by these two parity symbols consists of seven symbols. The example illustrates five separate blocks of data each covered by a single symbol correction code vv,ww,xx, yy,zz:

AAAAAAAvvBBBBBBBwwCCCCCCCxxDDDDDDD
yyEEEEEEEzz

Interleaved symbols transmitted over a noisy communications channel may be illustrated as:

ABCDEABCDEABCDEABCDEABCDEABCDE
vwxyzvwxvz

A burst error of five error symbols '#' injected in the interleaved data stream as follows:

ABCDEABCDEABCDEABC#####DEABCDEABCDE
vwxyzvwxyz

However, at the receiver end the blocks are De-Interleaved with each block having only a single correctable symbol error as follows:

AAAA#AAvvBBBB#BBwwCCCC#CCxxDDD#DDD
yyEEE #EEEzz

The encoding process appends a set of 2t parity symbols to the end of each data block such that, in the absence of any errors, the receiver generated 2t syndromes are all zeroes.

Generation of the Reed-Solomon parity symbols is defined by a generator polynomial of the form $g(x)=(x+\alpha^j)(x+\alpha^{j+1})(x+\alpha^{j+2})(x+\alpha^{j+3})\ldots(x+\alpha^{j+2t-2})(x+\alpha^{j+2t-1})$. Where t defines the number of correctable errors, j is the starting exponent of $\alpha$, and $\alpha$ is a prime element of GF(256). To be prime means that the $\log_2(\alpha)$ must have no common factors with the number 255 (i.e. 3, 5, or 17). The typical value used for $\alpha$ is 2.

For the class of single error Reed-Solomon codes where t=1 and $\alpha$=2 the generator polynomial is of the form $g(x)=(x+2^j)(x+2^{j+1})=x^2+(2^j+2^{j+1})x+2^{2j+1}$. Carrying out the indicated multiplication reveals the two coefficients ($C_1=2^j+2^{j+1}$ and $C_0=2^{2j+1}$) used to generate the two parity symbols for any selected value of j. Two commonly selected values for j are 0 and 1. The coefficients define the multipliers used to generate the parity symbols as shown in FIG. 1.

As shown in FIG. 1, generation of the n parity symbols is accomplished by XORing the received data with parity symbol Pn at XOR 2. The output of XOR 2 is then provided to multipliers 3 which operate on the data and provide the data to parity registers 4. The output of each successive parity register P0, P1 . . . Pn−1 is XORed with the output of each successive multiplier C1, C2 . . . Cn by XOR 5 and stored in the successive parity registers P1, P2 . . . Pn.

The use of single error correcting interleaved Reed-Solomon codes is specified in the downstream control path for several applications, including for example, Set-Top-Boxes, as defined by standards compliance documents DVS-167 and DVS-178. Set-Top-Boxes (STB) are used to connect a consumer's Television Set to the cable entering their home. The TV screen and STB remote control provide a means for the consumer to interact with the cable company through the STB in order to select and purchase TV programming.

The manufacturing cost of the STB is of critical importance in this application since STBs are typically provided to the cable customer at little or no charge. Cost of the final STB can be kept as low as possible by implementing each element that makes up a STB as efficiently as possible.

Speed of operation is also an important consideration for a correction scheme when applied to high-speed communication systems in order to minimize the time between receipt of data to generation of corrected data.

SUMMARY OF THE INVENTION

The method and circuits described herein provide a cost effective and efficient technique for performing single error Reed-Solomon error correction. The methods and circuit further provide an implementation of the requirements of error correction of the specifications in a typical Set-Top-Box in an efficient way using a minimum of circuits with regard to both the computation and control areas.

An apparatus according to the present invention may comprise: a syndrome generator that generates at least one syndrome based on a data stream; and a computation unit that performs the computations $$\text{temp}=(\text{Log}_2(S_2)-N)\text{Mod\_255}$$

$$\text{offset}_{0-n}=(\text{Log}_2(S_1)-\text{temp})\text{Mod\_255}$$

$$\text{temp}=(N-\text{offset}_{0-n})\text{Mod\_255}$$

$$\text{temp}=(\text{Log}_2(S_1)-\text{temp})\text{Mod\_255}$$

where:

S₁=a first syndrome

S₂=a second syndrome

N=blocksize−1.

The computation unit may comprise: a first selector that selects between a plurality of syndromes generated by the syndrome generator; a log table that provides a $\log_2$ of a selected syndrome; a second selector that selects between the $\log_2$ of a selected syndrome and N as a first operand; a third selector that selects between N and a predetermined value as the second operand; and an adder that determines the difference between the first operand and the second operand.

The computation unit may further comprise a half subtractor which performs a mod 255 operation on the output of the adder when the output of the adder is a negative value.

The computation unit may further comprise a controller that controls the computations of the computation unit to selectively generate an error offset and an error magnitude value.

The computation unit may further comprise an antilog table which determines the antilog of the error magnitude value to generate an error magnitude.

The computation unit may further comprise at least one register, and the error offset and the error magnitude value may be stored in the at least one register.

In the apparatus of the present invention the predetermined value may be a previously calculated difference between the first operand and the second operand.

A method for correcting errors in a data stream may comprise the steps of: receiving a byte of data; generating a plurality of syndromes based on the received data; and determining an error offset and an error magnitude using a single computation unit in a byte time.

The step of determining an error offset and an error magnitude may comprise the steps of: generating a $\log_2$ of a generated syndrome as a first operand; using block size−1 as a second operand; determining the difference between the first operand and the second operand; generating a third operand as a $\log_2$ of another generated syndrome; generating a fourth operand as the value indicative of the difference between the first operand and the second operand; and determining a value indicative of the difference between the third operand and the fourth operand, as the error offset.

A method for correcting errors in a data stream may further comprise the steps of: calculating blocksize−1 as a fifth operand; determining a sixth operand as the value indicative of the difference of the third operand and the fourth operand; determining the difference between the fifth operand and the sixth operand; determining a seventh operand as the value indicative of the difference between the fifth operand and the sixth operand; determining the difference between the third operand and the seventh operand as an error magnitude value; and determining an antilog of the error magnitude value as the error magnitude.

A method for correcting errors in a data stream may further comprise the steps of: generating a mod 255 adjustment of the difference between the first operand and the second operand when the difference between the first operand and the second operand is a negative value and the value indicative of the difference between the first operand and the second operand is the mod 255 adjustment.

A method for correcting errors in a data stream may further comprise the step of: generating a mod 255 adjustment of the difference between the third operand and the fourth operand when the difference between the third operand and the fourth operand is a negative value and the value indicative of the difference between the third operand and the fourth operand is the mod 255 adjustment.

A method for correcting errors in a data stream may further comprise the step of: generating a mod 255 adjustment of the difference between the third operand and the fourth operand when the difference between the third operand and the fourth operand is a negative value and the value indicative of the difference between the third operand and the fourth operand is the mod 255 adjustment.

A method for correcting errors in a data stream may further comprise the step of: generating a mod 255 adjustment of the difference between the fifth operand and the sixth operand when the difference between the fifth operand and the sixth operand is a negative value and the value indicative of the difference between the fifth operand and the sixth operand is the mod 255 adjustment.

A method for correcting errors in a data stream may further comprise the step of: generating a mod 255 adjustment of the difference between the third operand and the seventh operand when the difference between the third operand and the seventh operand is a negative value and the error magnitude value is the mod 255 adjustment.

A method for correcting errors in a data stream may comprise the steps of: calculating blocksize−1 as a fifth operand; determining a sixth operand as the difference of the third operand and the fourth operand; determining the difference between the fifth operand and the sixth operand; determining a seventh operand as 0; determining the difference between the third operand and the seventh operand as an error magnitude value; and determining an antilog of the error magnitude value as the error magnitude.

BRIEF DESCRIPTION OF THE DRAWINGS

The accompanying drawings, which are incorporated in and form a part of the specification, illustrate the various embodiments of the invention and, together with the description, serve to explain the principles of the invention. In the drawings.

DETAILED DESCRIPTION OF THE INVENTION

Figure 1:
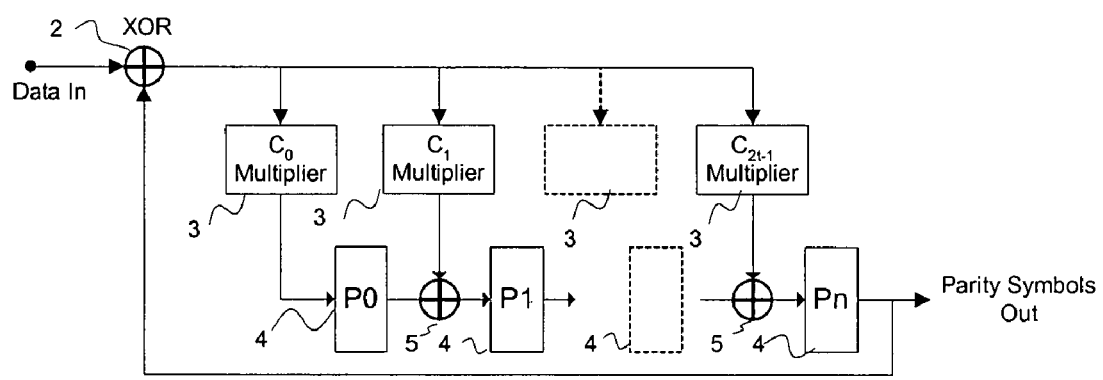
FIG. 1 illustrates a typical prior art architecture for the generation of parity symbols in a data stream.

The math used in generating Reed-Solomon parity symbols, syndrome symbols, and calculating correction information from the syndrome symbols is done within a set of numbers called a finite field or Galois field (GF). The key property of numbers within a Galois field is that the operations of addition, subtraction, multiplication, and division of any two numbers within the field always produce a result within the Galois field (except for division by zero which, like normal math, is undefined). Addition and subtraction are the same operation, which is a bitwise Exclusive-OR. This means that adding or subtracting the same two numbers produces a zero result (i.e. A+A=0, A−A=0). The zero element in a Galois field has the same properties as a zero in normal math (i.e. A+0=A, A*0=0). Multiplication and division are defined such that starting with one and continuously multiplying or dividing it by 2 will result in the generation of all nonzero elements of a specific Galois field.

Since the predominant size of data used for digital communications is grouped into 8 bit units, a matching Galois field with $2^8$ or 256 elements is used (0 to 255). Short hand notation for this finite field is $GF(2^8)$ or GF(256). As stated earlier, multiplying a one repeatedly by two results in the generation of all nonzero elements of the Galois field. A field generator polynomial is used to define the details of how multiplication and division are carried out. Multiplication by two in GF(256) is equivalent to shifting an 8 bit number left one bit. This results in the first seven products starting with one being 1, 2, 4, 8, 16, 32, 64, and 128. In normal math shifting an eight bit value of 128 left one more time would result in the remaining 8 bits being all zero which can not be allowed to happen if all 255 nonzero elements are to be generated. The field generator polynomial defines what value is added (XORed) back in when a one bit is shifted out. For example, if the field generator polynomial were $f(x)=x^8+x^4+x^3+x^2+1$ then the next product after 128 would be 256 XORed with 285 which is 29 (i.e. 0x100 xor 0x11D=0x1D).

For GF(256) there are sixteen suitable polynomials that can generate all 255 nonzero elements before repeating. Any one of the sixteen polynomials can be used as long as the same one is used during both the encoding and decoding process. However, polynomials with fewer terms require less logic to implement encoder and decoder functions. A commonly used polynomial is $f(x)=x^8+x^4+x^3+x^2+1$ which was used in the embodiment of this disclosure.

The following table lists all sixteen possible field generator polynomials and their bit vector representation for GF(256).

| Polynomial | Bit Vector in hex |
|---|---|
| $X^8 + x^4 + x^3 + x^2 + 1$ | 0x11D |
| $X^8 + x^5 + x^3 + x^1 + 1$ | 0x12B |
| $X^8 + x^5 + x^3 + x^2 + 1$ | 0x12D |
| $X^8 + x^6 + x^3 + x^2 + 1$ | 0x14D |
| $X^8 + x^6 + x^4 + x^3 + x^2 + x^1 + 1$ | 0x15F |
| $X^8 + x^6 + x^5 + x^1 + 1$ | 0x163 |
| $x^8 + x^6 + x^5 + x^2 + 1$ | 0x165 |
| $x^8 + x^6 + x^5 + x^3 + 1$ | 0x169 |
| $x^8 + x^6 + x^5 + x^4 + 1$ | 0x171 |
| $x^8 + x^7 + x^2 + x^1 + 1$ | 0x187 |
| $x^8 + x^7 + x^3 + x^2 + 1$ | 0x18D |
| $x^8 + x^7 + x^5 + x^3 + 1$ | 0x1A9 |
| $x^8 + x^7 + x^6 + x^1 + 1$ | 0x1C3 |
| $x^8 + x^7 + x^6 + x^3 + x^2 + x^1 + 1$ | 0x1CF |
| $x^8 + x^7 + x^6 + x^5 + x^2 + x^1 + 1$ | 0x1E7 |
| $x^8 + x^7 + x^6 + x^5 + x^4 + x^2 + 1$ | 0x1F5 |

Multiplication and division of GF(256) elements can be done by adding or subtracting the log base 2 of the numbers and then using a corresponding antilog table. Note that addition of the log values is done in the normal integer number system (i.e. 1+3=4). These tables are relatively small requiring only 256×8 bits of storage. The following program fragment can be used to generate the necessary values for the log and antilog tables. The constant Bit_Vector_Polynomial is selected from the above table.

Temp=1;
For I=0 to 254 do
Begin
Log[temp]=I;
Antilog[I]=Temp;
Temp=Temp shl 1; (* Shift Temp left one bit *)
If temp>255 then Temp=Temp XOR Bit_Vector_Polynomial;
End.

Figure 3:
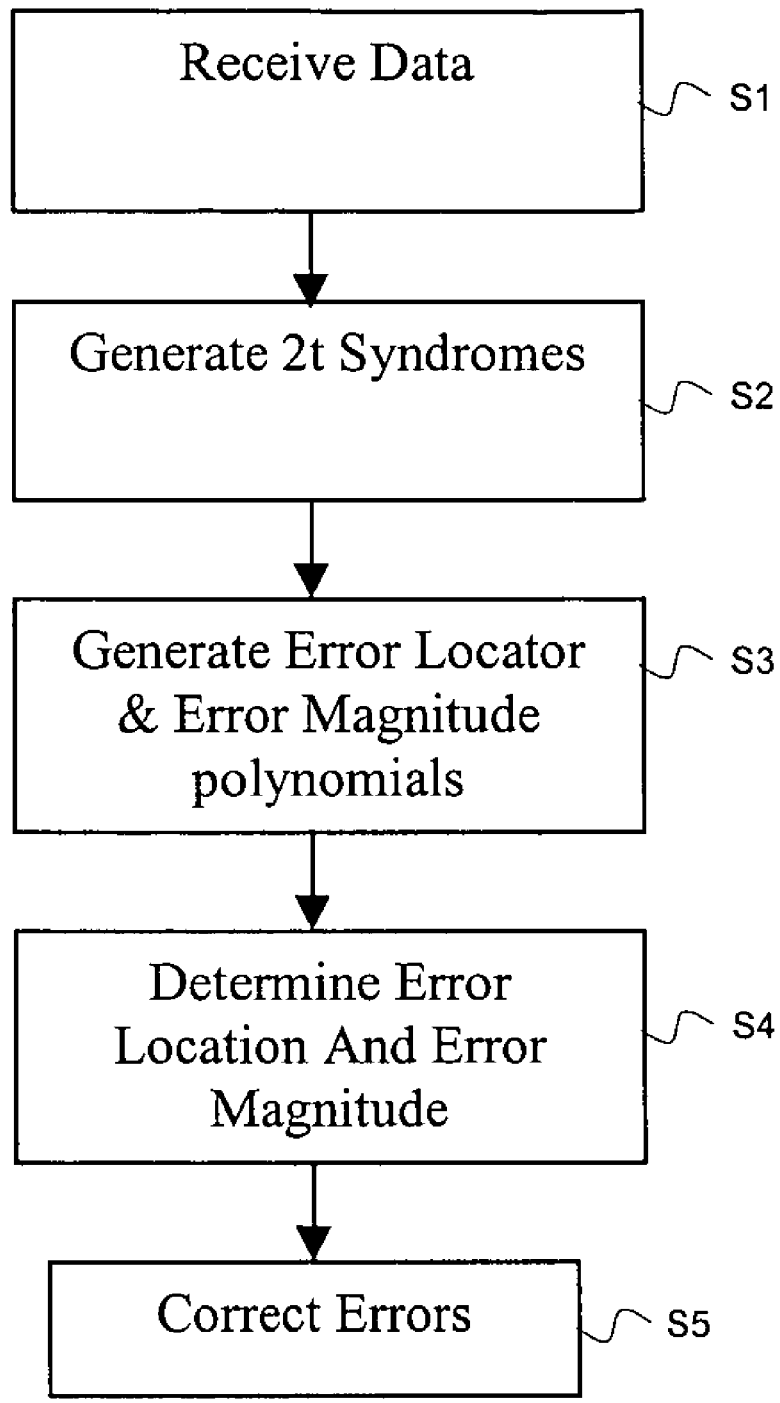
FIG. 3 illustrates an exemplary process in accordance with the present invention for determining an error.

The decoding process is illustrated in FIG. 3. In step S1 data is received, and in step S2 the received data is processed to generate 2t syndromes. Non-zero syndromes indicate the occurrence of at least one error in the received data. In step S3, the syndromes are processed to generate two polynomials one indicating the error locations and the other the error values. In step S4, the roots are found for each of the two polynomials where the roots are the error location number and error magnitude for each detected error.

When errors are introduced the value of each syndrome is based solely on the location and value of the injected error(s) as expressed in the following general equations (1). Where $Y_i$ is the error magnitude and $X_i$ is the error location number for each of the t errors. If k is the error offset in symbols from the end of the block then the corresponding error location number $X_i=2^k=\alpha^k$.

$$S_1=Y_1X_1^j+\ldots+Y_tX_t^j$$

$$S_2=Y_1X_1^{j+1}+\ldots+Y_tX_t^{j+1}$$

$$S_{2t}=Y_1X_1^{j+2t-1}+\ldots+Y_tX_t^{j+2t-1} \quad (1)$$

For the single error case (t=1), the second two steps of the decoding process can be combined into one since there is only a single error. The two syndrome equations can be solved directly to obtain the error location number and error magnitude.

When t=1 equation set 1 reduces to:

$$S_1=Y_1X_1^j \quad (2)$$

$$S_2=Y_1X_1^{j+1} \quad (3)$$

The error location number is extracted by dividing $S_2$ by $S_1$.

$$X_1=\frac{S_2}{S_1}=\frac{Y_1X_1^{j+1}}{Y_1X_1^j} \quad (4)$$

Based on the value of j one of the following equations is used to extract the error magnitude.

$$\text{If } j=0 \text{ then } Y_1=S_1=Y_1X_1^0 \quad (5)$$

$$\text{If } j=1 \text{ then } Y_1=\frac{S_1}{X_1}=\frac{Y_1X_1}{X_1} \quad (6)$$

$$\text{If } j>1 \text{ then } Y_1=\frac{S_1}{X_1^j}=\frac{Y_1X_1^j}{X_1^j} \quad (7)$$

In accordance with a preferred embodiment of the invention, a decoder which selectively decodes the j=0 and j=1 cases may be used. The hardware implementation of a suitable Reed-Solomon decoder may be simplified by further manipulation of equations 4, 5, and 6 to produce offset and correction equations in a format that can be easily carried out by specified circuits.

Since the solution of equation 6 requires the value of $X_1$ produced from equation 4, equation 4 is solved first. As stated earlier, one method of performing GF division is by taking the $\log_2$ of the numerator and denominator and subtracting the two. However this approach requires either two $\log_2$ tables in order to carry out the operation in one step or takes two steps and an additional storage elements to use a single $\log_2$ table.

In the preferred embodiment the error offset is an offset relative to the start of the block. In this manner the complete data block may be received, including the appended parity symbols, before the correction offset and error pattern can be computed.

The data blocks are typically stored in ascending address locations in a storage array and then read out once the offset and correction information are available. Such an offset can be derived from equation 4 with the following equation, where N=Blocksize−1.

$$\text{offset}_{0\text{-}n} = N - \text{Log}_2(X_1) = N - (\text{Log}_2(S_2) - \text{Log}_2(S_1)) \quad (8)$$

Rearranging equation 8 produces an equation with better implementation characteristics.

$$\text{offset}_{0\text{-}n} = \text{Log}_2(S_1) - (\text{Log}_2(S_2) - N) \quad (9)$$

Note that equation 9 is made up of two similar operations of taking the $\log_2$ of a syndrome and subtracting a quantity from it. For completeness, modulo 255 operators may be placed around each subtraction in the following equations to keep the results within the valid range of 0 to 254 for a GF(256), as shown in equation set (10).

$$\text{temp} = (\text{Log}_2(S_2) - N) \text{Mod\_255}$$

$$\text{offset}_{0\text{-}n} = (\text{Log}_2(S_1) - \text{temp}) \text{Mod\_255} \quad (10)$$

For the j=0 case the error magnitude is directly available as $S_1$ as shown in equation 5. For the j=1 case a division of $S_1$ by $X_1$ is required to extract the error magnitude. Unfortunately, equation set 10 does not compute $X_1$ or the more useful, for division, $\log_2(X_1)$. The results of equation set 10 can be written as:

$$\text{offset}_{0\text{-}n} = N - \text{Log}_2(X_1) \quad (11)$$

The same arithmetic operations defined by equation set 10 can be used to generate the $\log_2$ of the error magnitude $Y_1$, as shown in equation set 10.

$$\text{temp} = (N - \text{offset}_{0\text{-}n}) \text{Mod\_255}$$

$$\text{temp} = (\text{Log}_2(S_1) - \text{temp}) \text{Mod\_255} \quad (12)$$

For the j=0 case equation set 12 can be modified to generate the correct value by forcing temp in the second equation to zero. This has the effect of forcing $X_1$ in equation 6 to a 1, which reduces equation 6 to equation 5 (i.e. $Y_1=S_1/1=S_1$). This one minor change allows equation sets 10 and 12 to be used for both the j=0 and j=1 cases which simplifies the hardware implementation.

Figure 2:
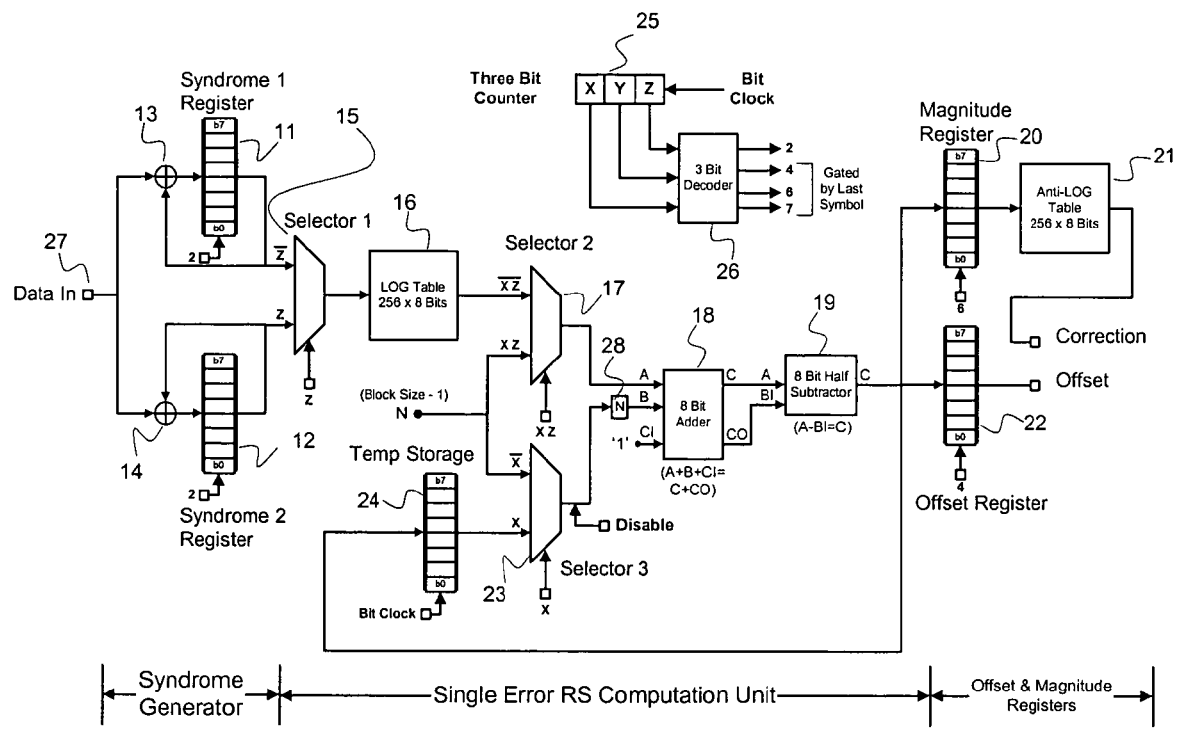
FIG. 2 illustrates an exemplary architecture in accordance with the present invention for determining an error offset and an error magnitude.

An exemplary circuit to generate the error offset and correction information to perform Reed-Solomon decoding in accordance with the present invention, is illustrated in FIG. 2. As illustrated in FIG. 2, an input 27 receives data, preferably de-interleaved data having parity bits. The received data is added with data in syndrome register 11 and syndrome register 12 by the syndrome generator ExOr operators 13 and 14, respectively, based on the selected value of j. The syndrome data in the syndrome registers 11 (S1) and 12 (S2) are selectively applied to log table 16 by the operation of selector 15 and the z bit from three bit counter 25. Log table 16 provides the $\log_2$ of the syndrome data. Selector 17 selects the $\log_2$ of the syndrome data (S1 or S2) or the result of the operation: Block size−1. Selector 17 provides the selected data as the A input to adder 18. Selector 23 selects between data stored in temporary storage register 24 and the result of the operation: Block size−1, and provides the selected data as the B input to adder 18 after being inverted by inverter block 28. The adder also receives a one bit carry in CI. The adder adds the values of A, B and CI to produce a value C and a carryout value CO. The value C and the CO are provided to a half subtractor 19 which performs any necessary mod 255 adjustment if the results of adder 18 are a negative value.

The results of the half subtractor 19 are saved in the temporary storage register 24. In addition to being saved in the temporary storage register 24, the results of the half subtractor 19 are saved in offset register 22 if they are obtained at the bit clock denoted by "4" in FIG. 2 from decoder 26. The results stored in offset register 22 provide the error offset value.

In addition to being saved in the temporary storage register 24, the results of the half subtractor 19 are also saved in a magnitude register 20 if they are obtained at the bit clock denoted by "6" in FIG. 2 from decoder 26. The results stored in the magnitude register 20 are provided to an anti-log table 21 which determines the anti log of the results. The anti-log of the results represent the error magnitude.

In the preferred embodiment, the control logic to step through the four equations may be implemented with three bit counter 25 and 3-to-8 decoder 26. As illustrated in FIG. 2, selector 15 may be driven by the z bit, selector 17 may be driven by the logical anding of the x and z bits and selector 23 may be driven by the x bit.

In the preferred embodiment, log table 16 may be implemented as a small 256 by 8 bit ROM, and anti-Log Look-Up table 21, may be implemented as a small 256 by 8 bit ROM. Also in the preferred embodiment, selectors 15, 17 and 23 may be 2-input 8 bit wide selectors, adder 18 may be an 8 bit adder unit, and half subtractor 19 may be an 8 bit Half Subtraction unit. Storage register 24 may be an 8 bit temporary storage register and storage registers 20 and 22 may be 8 bit registers to hold the calculated magnitude and offset values.

In FIG. 2, Selector 1 determines which syndrome is routed to the Log Table ROM. Selectors 2 & 3 control the A and B operands to the adder unit. Selector 2 routes either the output of the Log Table ROM or a constant representing the Reed-Solomon block size minus one to the A operand of the adder unit 18. Selector 3 routes either the block size minus one constant or the results of a previous adder operation to an inversion (N) element 28 whose output then feeds the B operand of the adder unit 18.

Inverting the input to the B operand and forcing the adder's carry-in active results in Selector 3's source being subtracted from the A operand. The results of the adder are fed into a half subtractor unit that performs a mod 255 adjustment on the adder unit's result. The carry-out of the adder unit controls whether the half subtractor unit subtracts a one. The results of the half subtractor unit are always latched in the temporary storage register 24 for possible use in the next calculation cycle.

FIG. 3 illustrates an exemplary process of performing error correction in a data stream. As illustrated in FIG. 3, data is received in step S1 and 2t syndromes are generated in step S2. In step S3, error locator and error magnitude polynomials are generated based on the 2t syndromes. In step S4, the t error location or offset and the error magnitude values are determined. The error location and the error magnitude are used to correct the error(s) in step S5. The computation of the error offset and the error magnitude consists of a series of steps, which for the case when t=1 match the four equations of equation sets 10 and 12.

Figure 4A:
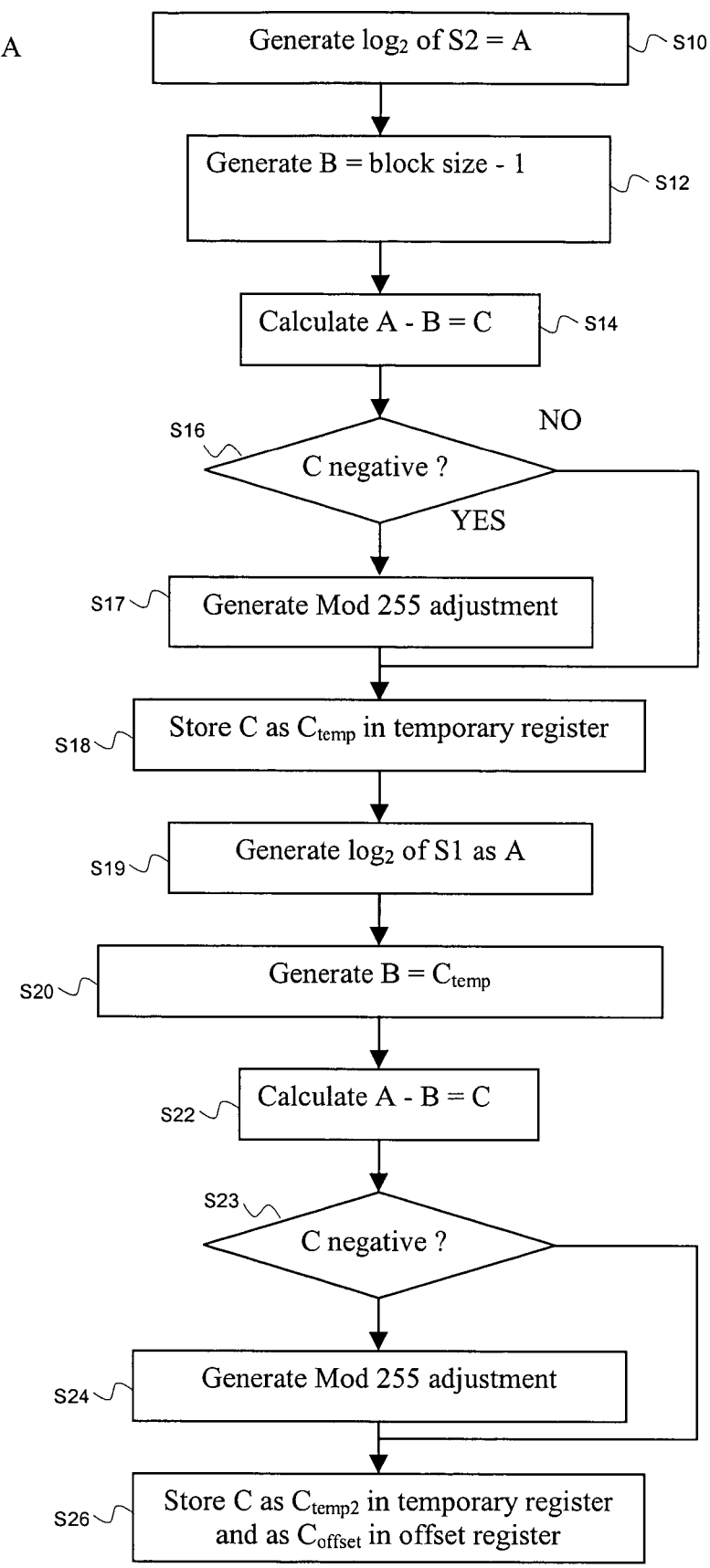
FIGS. 4A and 4B illustrate exemplary processes for determining an error offset and an error magnitude, respectively in accordance with the present invention.

FIG. 4A illustrates an exemplary process of determining the error offset. As illustrated in step S10 of FIG. 4A, the $\log_2$ of syndrome S2 is generated as the variable A. As illustrated in step S12, the value B is set to the block size−1. The difference of A and B are obtained in step S14 as C. If the value of C is negative (YES in step S16) then a mod 255 adjustment is made to C (step S17) and the adjusted value of C is stored in a temporary register, such as temporary register 24 in FIG. 2, as $C_{temp}$ in step S18. If the value of C is not negative (NO in step S16) then the value of C is stored in a temporary register, such as temporary register 24 in FIG. 2, as $C_{temp}$ in step S18. In step S19, the value of A is reset to be the $\log_2$ of syndrome S1. The value of B is reset to be $C_{temp}$, as shown in step S20. The difference of A and B is determined as C again (step S22) and a mod 255 adjustment is performed on C if the value of C is negative (step S23 and S24)). Either C or adjusted C is stored in a temporary register, such as temporary register 24 in FIG. 2, as $C_{temp2}$ and also in an offset register, such as offset register 22, as $C_{offset}$, as illustrated in step S26.

Figure 4B:
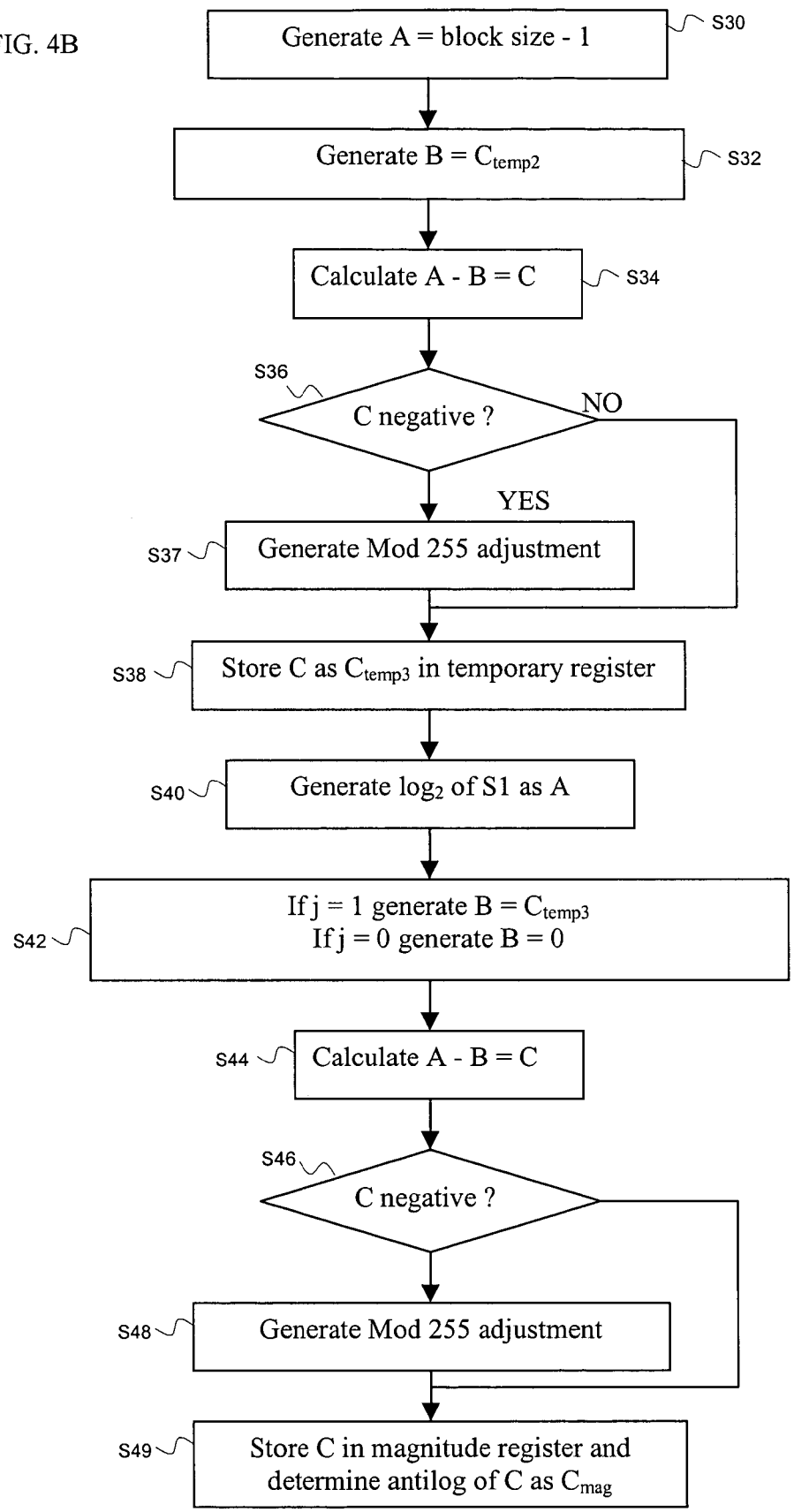

FIG. 4B illustrates an exemplary process of determining an error magnitude. As illustrated in FIG. 4B, the value of A is set to the block size−1 (step S30) and the value of B is set to $C_{temp2}$ (step S32). The difference of A and B are obtained in step S34 as C. If the value of C is negative (YES in step S36) then a mod 255 adjustment is made to C (step S37) and the adjusted value of C is stored in a temporary register, such as temporary register 24 in FIG. 2, as $C_{temp3}$ in step S38. If the value of C is not negative (NO in step S36) then the value of C is stored in a temporary register, such as temporary register 24 in FIG. 2, as $C_{temp3}$ in step S38. In step S40, the value of A is reset to be the $\log_2$ of syndrome S1. As shown in step S42, the value of B is reset to be $C_{temp3}$ if j=1, or reset to be 0 if j=0. The difference of A and B is determined as C again (step S44) and a mod 255 adjustment is performed on C if the value of C is negative (steps S46 and S48). Either C or adjusted C is stored in a magnitude register, such as magnitude register 20 in FIG. 2, and the antilog of C is determined as $C_{mag}$, as illustrated in step S49.

The antilog table's placement on the output of the register in the embodiment of FIG. 2, as opposed to the input of the register, avoids the added delay of having two table lookups in the computation path.

Figure 5:
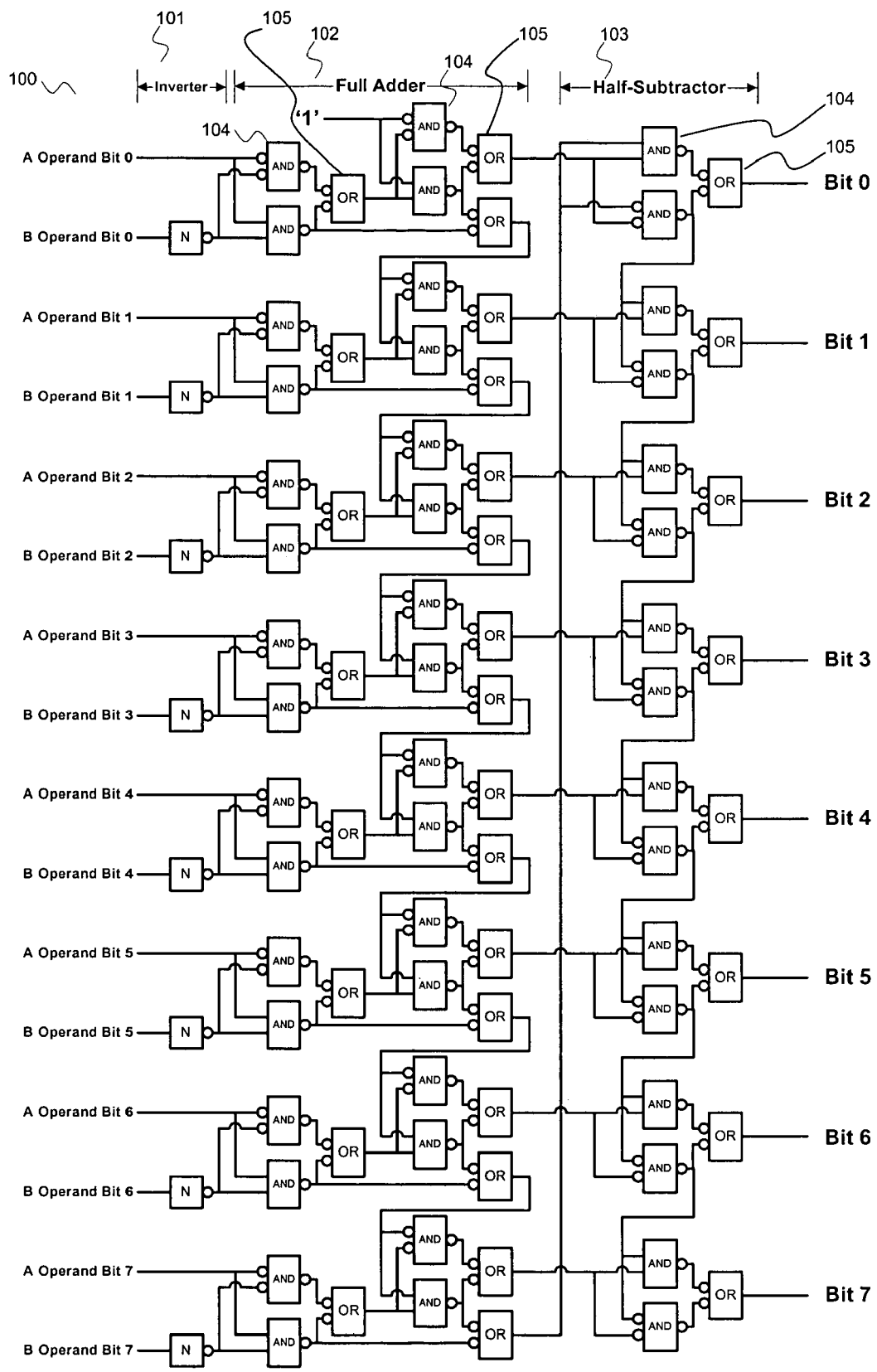
FIG. 5 illustrates an exemplary architecture for correcting an error in accordance with the present invention.

FIG. 5 illustrates an exemplary architecture for a correction computation unit 100. The correction computation unit 100 consists of an inverter 101 on the B operand, an 8 bit adder 102 and an 8 bit half-subtractor 103 for each of bits 0-7. As illustrated in FIG. 5, the basic logic connections required to perform these operations may comprise basic two-input AND/NAND gates 104 and OR/NOR gates 105. An implementation may also include additional carry and borrow look-ahead circuits (not shown) to reduce logic delays if required to meet system timings requirements.

The correction unit can also be implemented by cascading two pairs of 4-bit full adders together where the second set has their B operand forced to 0xFF.

Figure 6:
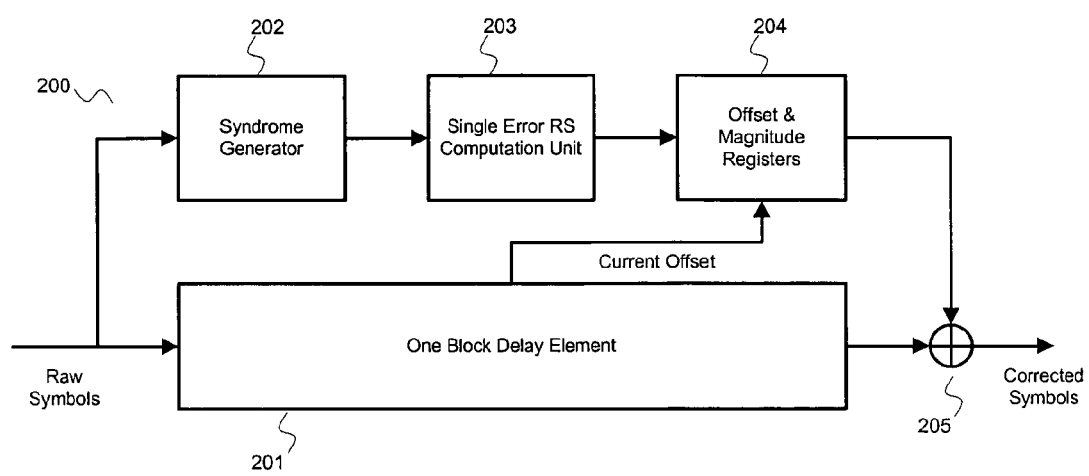
FIG. 6 illustrates an exemplary error correction system which may utilize the architecture and methods of FIGS. 2-5 in accordance with the present invention.

An exemplary correction system 200 capable of utilizing the correction techniques illustrated in FIGS. 2-4B is illustrated in FIG. 6. The system of FIG. 6 preferably processes a continuous stream of symbols calculating and applying corrections as required.

Specifically, FIG. 6 illustrates an exemplary complete correction system in accordance with the present invention that includes a delay element 201 added to the logic shown in FIG. 2. Symbols entering the delay element 201 preferably emerge at the output exactly one Reed-Solomon block time later at which time any necessary correction may be applied. During this delay the syndromes for the data block may be calculated by syndrome generator 202 and the offset and error magnitude computed by computation unit 203 and stored in registers 204. At the calculated error offset the delayed data may be XoRed with the stored error magnitude correcting the detected error.

Figure 7:
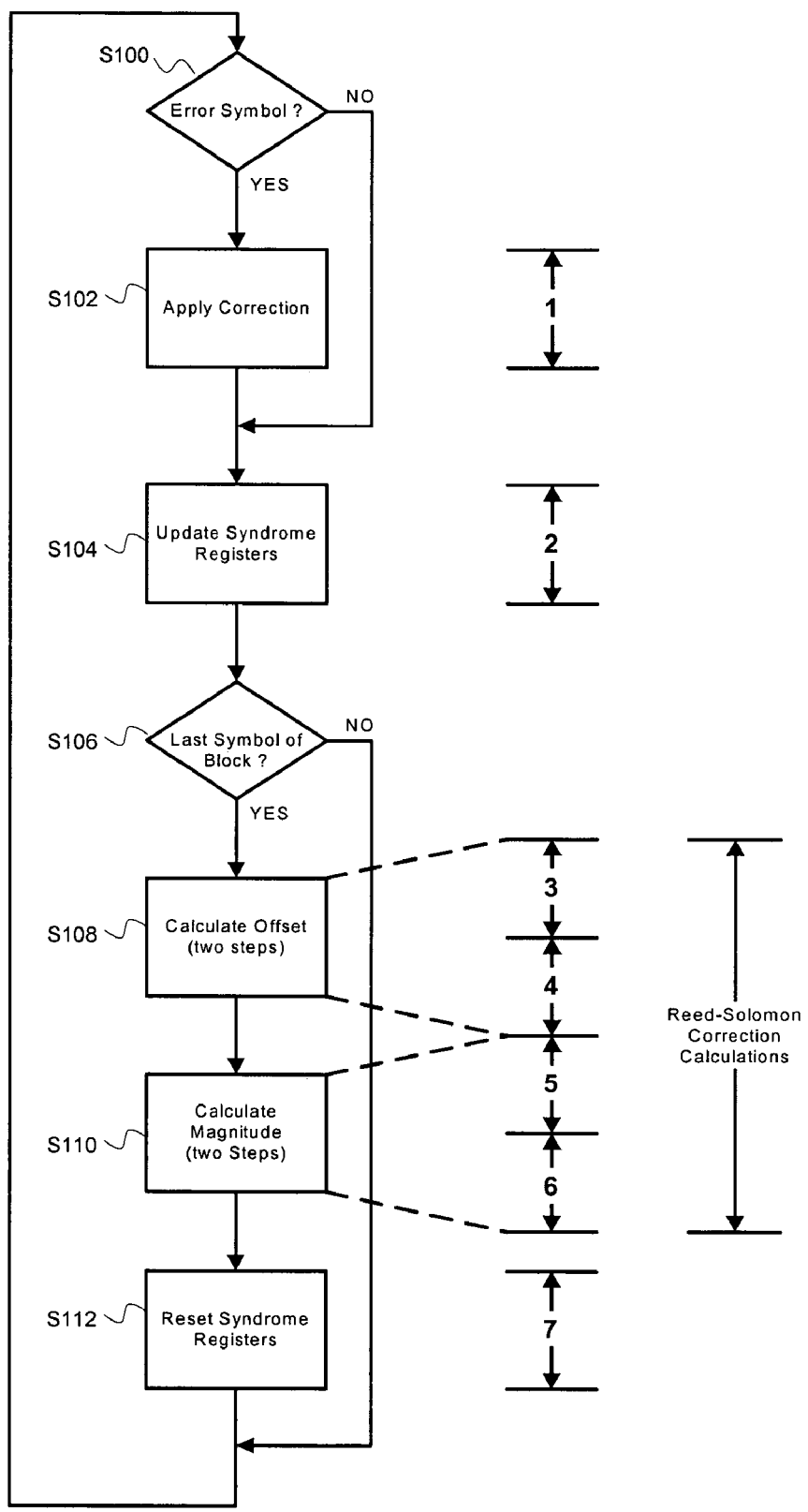
FIG. 7 illustrates an exemplary error correction control sequence which may be utilized with the error correction system of FIG. 6.

FIG. 7 illustrates an exemplary correction control sequence according to the present invention, which preferably includes the application of the correction, syndrome generation, and correction calculation. Using a symbol bit clock all the required operations can be accomplished within one eight bit symbol time. If the eight bit clocks are numbered 0 through 7, then the right column of numbers in FIG. 7 gives the bit time that each of the seven operations are performed in.

In the preferred embodiment, one loop through the state machine shown in FIG. 7 occurs for each symbol processed. The seven steps are grouped into the three basic operations of correction, syndrome generation and correction calculation. In the preferred embodiment, only syndrome generation occurs each symbol time. Correction and correction calculation are conditional steps with correction calculation preferably occurring once per block during the last symbol of the block and correction preferably occurring at most once per block at the location indicated by the offset value.

As each symbol emerges from delay element 201 its offset relative to the start of the Reed-Solomon block is compared at step S100 with the saved calculated error offset from step S108. If an error has been detected and the two offsets are equal then the saved error magnitude value from step S110 is applied to correct the symbol as illustrated in step S102 by XOR 205.

Next, as each new symbol is received it is accumulated into the syndrome registers and stored in the delay element as illustrated in step S104.

Correction calculations are enabled when the last block symbol is received as depicted by step S106. At this point the syndrome registers hold all the information necessary to signal an error and correct it. The calculation illustrated in FIGS. 4A and 4B is preferably executed and the offset and magnitude registers are updated with new values as illustrated in steps S108 and S110. The last step is to clear the syndrome registers readying them for the next block as illustrated in step S112.

Two critical cases that are easily handled by this method are an error in the first and last symbol of the block. An error in the first symbol requires that the offset and magnitude values are ready before the start of the next symbol. An error in the last symbol requires that the correction be applied before the offset and magnitude registers are updated with new values, which limits how early the correction calculations can start.

The present invention disclose a method and circuit for calculating the necessary information to correct "single error" Reed-Solomon codes. The advantage this method has over previous methods is its simplicity of design and the minimum steps required to convert the syndrome information into an error location and correction pattern. The maximum of four cycles (steps) needed to compute the offset and correction pattern means that a correction can be applied in the byte time immediately following receipt of the last check byte. It also means that the syndrome generation hardware is free to start generating a new set of syndromes for the next block. This avoids the need for additional syndrome and data buffering hardware.

Having fully described a preferred embodiment of the invention and various alternatives, those skilled in the art will recognize, given the teachings herein, that numerous alternatives and equivalents exist which do not depart from the invention. For example, the exemplary architecture illustrated in FIG. 2 may be implemented by a plurality of circuit elements as a hardware implementation or as a programmed microprocessor or any programmable processing element(s). Likewise the architecture of FIG. 5 and/or 6 may also be implemented as a hardware implementation or as a programmed microprocessor or any programmable processing element(s). Those of skill in the art will also appreciate that one or more of the architectures of FIGS. 2, 5 and 6 may be programmed on the same microprocessor or any programmable processing element(s). Likewise the methods illustrated in FIGS. 3, 4A, 4B and 7 may be performed by an appropriately configured hardware system or an appropriately programmed microprocessor or any suitable programmable processing element(s). It is therefore intended that the invention not be limited by the foregoing description, but only by the appended claims.

What is claimed is:

1. An apparatus for correcting errors in a data stream comprising:

a syndrome generator that generates at least one syndrome based on a data stream; and a computation unit that performs the computations $$\text{temp}=(\text{Log}_2(S_2)-N)\text{Mod}\_255$$

$$\text{offset}_{0-n}=(\text{Log}_2(S_1)-\text{temp})\text{Mod}\_255$$

$$\text{temp}=(N-\text{offset}_{0-n})\text{Mod}\_255$$

$$\text{temp}=(\text{Log}_2(S_1)-\text{temp})\text{Mod}\_255$$

where:

$S_1$=a first syndrome
$S_2$=a second syndrome
N=blocksize−1.

2. The apparatus for correcting errors in a data stream according to claim 1, wherein the computation unit comprises:

a first selector that selects between a plurality of syndromes generated by the syndrome generator;

a log table that provides a $\log_2$ of a selected syndrome;

a second selector that selects between the $\log_2$ of a selected syndrome and N as a first operand;

a third selector that selects between N and a predetermined value as the second operand; and an adder that determines the difference between the first operand and the second operand.

3. The apparatus for correcting errors in a data stream according to claim 2, wherein the computation unit further comprises:

a half subtractor which perform a mod 255 operation on the output of the adder when the output of the adder is a negative value.

4. The apparatus for correcting errors in a data stream according to claim 2, wherein the computation unit further comprises:

a controller that controls the computations of the computation unit to selectively generate an error offset and an error magnitude value.

5. The apparatus for correcting errors in a data stream according to claim 4, wherein the computation unit further comprises an antilog table which determines the antilog of the error magnitude value to generate an error magnitude.

6. The apparatus for correcting errors in a data stream according to claim 4, wherein the computation unit further comprises at least one register and the error offset and the error magnitude value are each stored in the at least one register.

7. The apparatus for correcting errors in a data stream according to claim 2, wherein the predetermined value is a previously calculated difference between the first operand and the second operand.

8. A method for correcting errors in a data stream comprising the steps of:

receiving a byte of data;

generating a plurality of syndromes based on the received data; and determining an error offset and an error magnitude based on the syndromes using a single computation unit in a byte time, wherein the byte time is the time required to complete the corresponding syndromes for the next byte of data.

9. The method for correcting errors in a data stream according to claim 8, wherein the step of determining an error offset and an error magnitude comprises the steps of:

generating a $\log_2$ of a generated syndrome as a first operand;

calculating block size−1 as a second operand;

determining the difference between the first operand and the second operand;

generating a third operand as a $\log_2$ of another generated syndrome;

generating a fourth operand as a value indicative of the difference between the first operand and the second operand; and determining a value indicative of the difference between the third operand and the fourth operand as the error offset.

10. The method for correcting errors in a data stream according to claim 9, wherein the step of determining an error offset and an error magnitude comprises the steps of:

calculating blocksize−1 as a fifth operand;

determining a sixth operand as a value indicative of the difference of the third operand and the fourth operand;

determining the difference between the fifth operand and the sixth operand;

determining a seventh operand as a value indicative of the difference between the fifth operand and the sixth operand;

determining the difference between the third operand and the seventh operand as an error magnitude value; and determining an antilog of the error magnitude value as the error magnitude.

11. The method for correcting errors in a data stream according to claim 10, wherein the step of determining an error offset and an error magnitude comprises the steps of:

generating a mod 255 adjustment of the difference between the third operand and the fourth operand when the difference between the third operand and the fourth operand is a negative value and the value indicative of the difference between the third operand and the fourth operand is the mod 255 adjustment.

12. The method for correcting errors in a data stream according to claim 10, wherein the step of determining an error offset and an error magnitude comprises the steps of:

generating a mod 255 adjustment of the difference between the fifth operand and the sixth operand when the difference between the fifth operand and the sixth operand is a negative value and the value indicative of the difference between the fifth operand and the sixth operand is the mod 255 adjustment.

13. The method for correcting errors in a data stream according to claim 10, wherein the step of determining an error offset and an error magnitude comprises the steps of:

generating a mod 255 adjustment of the difference between the third operand and the seventh operand when the difference between the third operand and the seventh operand is a negative value and the error magnitude value is the mod 255 adjustment.

14. The method for correcting errors in a data stream according to claim 9, wherein the step of determining an error offset and an error magnitude comprises the steps of:

generating a mod 255 adjustment of the difference between the first operand and the second operand when the difference between the first operand and the second operand is a negative value and the value indicative of the difference between the first operand and the second operand is the mod 255 adjustment.

15. The method for correcting errors in a data stream according to claim 9, wherein the step of determining an error offset and an error magnitude comprises the steps of:

generating a mod 255 adjustment of the difference between the third operand and the fourth operand when the difference between the third operand and the fourth operand is a negative value and the value indicative of the difference between the third operand and the fourth operand is the mod 255 adjustment.

16. The method for correcting errors in a data stream according to claim 9, wherein the step of determining an error offset and an error magnitude comprises the steps of:

calculating blocksize−1 as a fifth operand;

determining a sixth operand as the difference of the third operand and the fourth operand;

determining the difference between the fifth operand and the sixth operand;

determining a seventh operand as 0;

determining the difference between the third operand and the seventh operand as an error magnitude value; and determining an antilog of the error magnitude value as the error magnitude.

17. The method for correcting errors in a data stream according to claim 16, wherein the step of determining an error offset and an error magnitude comprises the steps of:

generating a mod 255 adjustment of the difference between the third operand and the fourth operand when the difference between the third operand and the fourth operand is a negative value and the value indicative of the difference between the third operand and the fourth operand is the mod 255 adjustment.

18. The method for correcting errors in a data stream according to claim 16, wherein the step of determining an error offset and an error magnitude comprises the steps of:

generating a mod 255 adjustment of the difference between the fifth operand and the sixth operand when the difference between the fifth operand and the sixth operand is a negative value and the value indicative of the difference between the fifth operand and the sixth operand is the mod 255 adjustment.

19. The method for correcting errors in a data stream according to claim 16, wherein the step of determining an error offset and an error magnitude comprises the steps of:

generating a mod 255 adjustment of the difference between the third operand and the seventh operand when the difference between the third operand and the seventh operand is a negative value and the error magnitude value is the mod 255 adjustment.

* * * * *